(12) United States Patent
Peng et al.

(10) Patent No.: US 11,760,641 B2
(45) Date of Patent: Sep. 19, 2023

(54) METHOD FOR MANUFACTURING SUSPENDED GRAPHENE SUPPORT FILM BY SELECTIVELY ETCHING GROWTH SUBSTRATE

(71) Applicant: PEKING UNIVERSITY, Beijing (CN)

(72) Inventors: Hailin Peng, Beijing (CN); Liming Zheng, Beijing (CN); Bing Deng, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 371 days.

(21) Appl. No.: 17/295,242

(22) PCT Filed: Oct. 14, 2019

(86) PCT No.: PCT/CN2019/110916
§ 371 (c)(1),
(2) Date: May 19, 2021

(87) PCT Pub. No.: WO2020/103605
PCT Pub. Date: May 28, 2020

(65) Prior Publication Data
US 2021/0395092 A1    Dec. 23, 2021

(30) Foreign Application Priority Data
Nov. 20, 2018 (CN) .......................... 201811381142.1

(51) Int. Cl.
*C01B 32/194* (2017.01)
*C30B 25/10* (2006.01)
(Continued)

(52) U.S. Cl.
CPC ............ *C01B 32/194* (2017.08); *C30B 25/10* (2013.01); *C30B 25/165* (2013.01); *C30B 25/18* (2013.01);
(Continued)

(58) Field of Classification Search
None
See application file for complete search history.

(56) References Cited

U.S. PATENT DOCUMENTS

2013/0210218 A1    8/2013  Accardi et al.
2018/0263118 A1*   9/2018  Pun ...................... H05K 1/0346

FOREIGN PATENT DOCUMENTS

CN    102222607 A    10/2011
CN    102249175 A    11/2011
(Continued)

OTHER PUBLICATIONS

First Office Action issued in corresponding Chinese Application No. 201811381142.1; dated Mar. 13, 2020; 10 pgs.
(Continued)

*Primary Examiner* — Roberts P Culbert
(74) *Attorney, Agent, or Firm* — HAUPTMAN HAM, LLP (57) ABSTRACT

A method for preparing suspended graphene support film by selectively etching growth substrate is disclosed in present invention. The transfer process of graphene is avoided. The process of present invention is efficient and low in cost, suspended graphene support film can be prepared in a single etching step. The prepared graphene support film does not need any support by polymer film and polymer fiber. The prepared graphene support film has controllable number of layers and high intactness (90%-97%), large suspended area (diameter is 10-50 μm), wide clean area (>100 nm) and can be mass-produced. In addition, the graphene support film can be directly used as transmission electron microscope support film, and can be used to achieve high resolution imaging of nanoparticles.

9 Claims, 5 Drawing Sheets (51) Int. Cl.
*C30B 25/16* (2006.01)
*C30B 25/18* (2006.01)
*B82Y 30/00* (2011.01)
*B82Y 40/00* (2011.01)

(52) U.S. Cl.
CPC .............. *B82Y 30/00* (2013.01); *B82Y 40/00* (2013.01); *C01B 2204/04* (2013.01)

(56) References Cited

FOREIGN PATENT DOCUMENTS

| | | |
|---|---|---|
| CN | 103342356 A | 10/2013 |
| CN | 104787754 A | 7/2015 |
| CN | 106435727 A | 2/2017 |
| CN | 106872501 A | 6/2017 |
| CN | 108428794 A | 8/2018 |
| CN | 109437176 A | 3/2019 |

OTHER PUBLICATIONS

International Search Report issued in corresponding International Application No. PCT/CN2019/110916; dated Jan. 14, 2020; China National Intellectual Administration, Beijing, China, 6 pgs.
Written Opinion issued in corresponding International Application No. PCT/CN2019/110916; dated Jan. 14, 2020; China National Intellectual Administration, Beijing, China; 9 pgs.

* cited by examiner

METHOD FOR MANUFACTURING SUSPENDED GRAPHENE SUPPORT FILM BY SELECTIVELY ETCHING GROWTH SUBSTRATE

RELATED APPLICATIONS

The present application is a National Phase of International Application Number PCT/CN2019/110916 filed Oct. 14, 2019 and claims priority to Chinese Application Number 201811381142.1 filed Nov. 20, 2018.

TECHNICAL FIELD

The present invention relates to a method for preparing suspended graphene support film by selectively etching growth substrate.

BACKGROUND

Graphene which is a monoatomic layer two-dimensional material with high mechanical strength, high electrical conductivity and high thermal conductivity, has excellent application prospects in the fields of supporting films, filter films, diaphragms and the like. For example, the suspended graphene film can be directly used as a transmission electron microscope support film to improve imaging resolution. The suspended monolayer graphene can be directly used as a hydrogen isotope separation film to achieve the enrichment of hydrogen isotope. In the existing methods for preparing graphene, chemical vapor deposition (CVD) is suitable for mass-producing high-quality graphene film on metal substrates such as copper foil and the like, and meeting the requirement of large-scale applications of graphene. However, it is still a major challenge to separate the graphene from the growth substrate and obtain a suspended graphene support film. At present, the preparation method of graphene support film mainly comprises the following categories: 1. Spin-coating a polymer film (such as PMMA) on graphene grown by CVD, transferring the graphene onto a suspended substrate after etching off the metal substrate, then removing the polymer film to obtain the suspended graphene. The suspended graphene obtained by this method has low intactness and serious polymer contamination. 2. Transferring the graphene onto a gold mesh containing a carbon film assisted with isopropanol. Although the contamination of polymer can be avoided in this method, the process of this method is costly and instable, cannot be used to prepare graphene support film on a large scale. 3. Pre-spin-coating photoresist to protect graphene, and selectively etching the graphene growth substrate by photolithography, then removing the photoresist to obtain suspended graphene directly. This method can be used for mass-producing the graphene support films, however, photoresist contamination on the surface of graphene is still unavoidable.

Therefore, the development of method, which is low in cost and suitable for mass-producing ultraclean, high-intactness graphene support film, is extremely important for the large-scale application of graphene in the field of multifunctional diaphragms.

DISCLOSURE OF THE INVENTION

The objective of the present invention is to provide a method for preparing suspended graphene support film by selectively etching growth substrate. The graphene support film obtained by the method does not require any auxiliary support. The graphene support film has high intactness, large suspended area, wide clean area, and can be mass-produced.

A method for preparing suspended graphene support film provided by the present invention, comprises:

1) growing graphene films on both surfaces of metal substrate;
2) etching off the graphene film on one side of the metal substrate obtained from step 1), spin-coating photoresist, and performing photolithography, to obtain graphene/metal substrate/photoresist composite;
3) suspending the graphene/metal substrate/photoresist composite obtained from step 2) on the liquid surface of the etching solution, completely etching the metal substrate exposed by said photolithography process using etching solution, and, removing the photoresist to obtain the suspended graphene support film.

In step 1) of the above described method, said metal substrate is single crystal and/or polycrystalline substrate of transition metal or transition metal alloy. Said transition metal is selected from at least one of copper, nickel, molybdenum, and gold. Said transition metal alloy is specifically a copper-nickel alloy;

The thickness of said metal substrate is 10-30 μm;

Said graphene film is a monolayer large-domain single crystal graphene film, bilayer graphene film or few-layer graphene film. Said few-layer graphene film is specifically 2-5 layer graphene film.

In said growth step, the growth process is chemical vapor deposition process.

Specifically, in said chemical vapor deposition process, the growth temperature is 980° C.-1050° C.; specifically may be 1030° C.;

Carrier gas is selected from at least one of hydrogen and argon;

The flow rate of carrier gas is 100-2000 sccm, specifically is 100 or 500 sccm;

Carbon source gas is methane, ethylene or ethane;

The flow rate of carbon source gas is 1-10 sccm.

The flow rate of carrier gas in said growth of monolayer large-domain single crystal graphene film is 100-1000 sccm;

The annealing process is carried out by first annealing at 980-1050° C. for 0.5-8 h under 50-500 sccm hydrogen, then annealing for 10-60 min under 50-500 sccm argon;

Said annealing process is specifically carried out by first annealing at 1030° C. for 30 minutes under 100 sccm hydrogen, keeping the pressure at 100 Pa, then annealing for 30 minutes under 100 sccm argon;

Growth time is 2-5 hours; specifically is 3 hours;

Growth pressure is 100-1000 Pa, specifically is 500 Pa;

The flow rate of carrier gas in said growth of bilayer graphene film is 100-1000 sccm; specifically is 400 sccm;

The annealing process is carried out by annealing at 980° C.-1050° C. for 0.5-8 h under 50-500 sccm hydrogen; said annealing process is specifically carried out by first annealing at 1030° C. for 30 minutes under 100 sccm hydrogen, keeping the pressure at 100 Pa;

Growth pressure is 500-2000 Pa, specifically is 1000 Pa;

Growth time is 1-4 hours; specifically is 1.5 hours;

The flow rate of carrier gas in said growth of few-layer graphene film is 500-2000 sccm;

The annealing process is carried out by annealing for 0.5-8 h under 50-500 sccm hydrogen; said annealing process is specifically carried out by first annealing at 1030° C. for 30 minutes under 100 sccm hydrogen, keeping the pressure at 100 Pa;

Growth pressure is 1000-4000 Pa, specifically is 2000 Pa;

Growth time is 1-3 hours.

Through this step 1), a graphene film with controllable number of layers can be obtained;

In the step, graphene can be grown in high temperature tube furnace with 1-4 inches diameter, and can combine with a roll-to-roll device;

In said step 2), the etching process is an air plasma etching process; excitation power is 100-500 watts, specifically is 200 watts; etching time is 2-5 minutes, specifically is 3 minutes; gas flow rate is 10-30 sccm;

Said photoresist is positive photoresist; spin-coating rate is 2000-7000 rpm, specifically is 4000 rpm; spin-coating time is 50-70 s, specifically is 60 s;

Said photolithography is exposed to UV light at 350-365 nm or electron beam, exposure time is 5-15 s, specifically is 10 s;

In the photolithography process, circular pattern can be formed; in said circular pattern, the circular hole diameter is 5-20 microns; said circular pattern specifically is array of circular holes, in said array of circular holes, the translation period of circular pattern is 50-100 microns.

In the etching process of said step 3), etching temperature is 20-60° C., specifically is 50-60° C.;

The etching solution is sodium persulfate solution, ferric chloride solution or aqua regia. Concentration is 0.05-0.2 mol/L; the volume ratio of nitric acid to hydrochloric acid in said aqua regia is 1:3.

Said photoresist removal process is carried out by first treating with acetone, ethanol or N-methylpyrrolidone, and then treating with isopropanol.

In said photoresist removal process, the transfer medium of suspended graphene support film in different solution is metal mesh.

The pore size of said metal mesh is 10-100 μm.

In addition, the suspended graphene support film prepared according to the above described method also belongs to the protection scope of the present invention.

PREFERRED EMBODIMENT OF THE INVENTION

Hereafter the present invention will be described with reference to the embodiments, but the scope of the present invention is not limited to the embodiments described below.

The experimental methods used in the following embodiments are conventional unless otherwise specified. The materials and reagents used, unless otherwise specified, can be obtained from commercial means.

In the following embodiments, the metal substrate used for growing graphene is copper foil, the copper foil is electrochemistry polished before the growth of graphene.

In the following embodiments, the array of circular holes of photoresist is prepared by URE-2000/35 ultraviolet lithography machine, the exposure wavelength of UV lamp is 365 nm, exposure time is 5-15 seconds. The model of said positive photoresist is AR-P5350. The model of said developer is AR 300-26, ratio of the developer and water is 1:7. Said fixer solution is pure water.

In the following embodiments, the prepared graphene and suspended graphene support film are characterized, including the number of layer, intactness, suspended area, cleanliness and atomic structure of the graphene. The measurement method is described as follows:

Measurement of the number of layer, intactness and suspended area of the graphene support film: the number of layer, broken condition and suspended area of the suspended graphene support film can be characterized by using a scanning electron microscope (Hitachi S-4800). After transferring the graphene onto a silicon wafer containing a 300 nm oxide layer, the number of layer can be characterized by using an optical microscope (Nikon, DS-Ri2) as well.

Characterization of the cleanliness and atomic structure of graphene support film: they are characterized by using a transmission electron microscope (FEI Tecnai F30, accelerating voltage 300 kV; FEI 80-300 Environmental Titan, accelerating voltage 80 kV; Nion UltraSTEM 200, accelerating voltage 60 kV).

Figure 1:
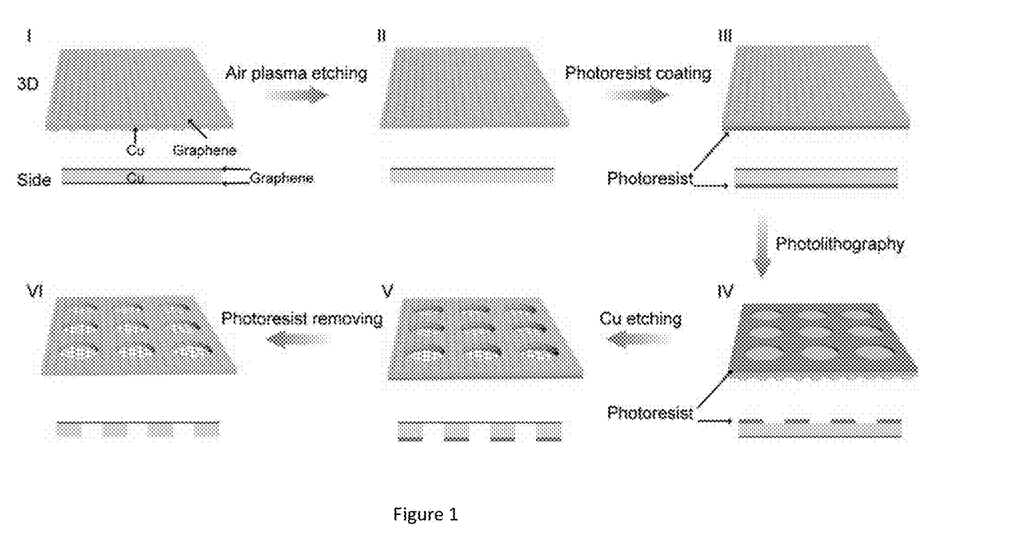
FIG. 1 is a flow chart of the process for preparing suspended graphene support film by selectively etching growth substrate of the present invention.

Embodiment 1, Preparation of Graphene Support Film by Selectively Etching Copper Foil Substrate FIG. 1 is a process flow chart of the present invention. A specific implementation process is as follows:

I) Growing graphene films with controllable number of layers on the copper foil substrate by low pressure chemical vapor deposition (LPCVD).

Growth process of monolayer large single crystal graphene: copper foil (with 99.8% purity and 25 μm thickness) is first annealed at 1030° C. for 30 minutes under 100 sccm hydrogen, keeping the pressure around 100 Pa, in order to remove the organic matters and oxide layer on surface of the copper foil. Then it is annealed for 30 minutes under 100 sccm Argon, in order to passivate active sites on surface of the copper foil. After completion of the annealing process, graphene is grown at 1030° C., under 500 sccm hydrogen and 1 sccm methane, keeping the pressure around 500 Pa, growth time 3 hours.

Growth process of bilayer graphene: copper foil (with 99.8% purity and 25 μm thickness) is first annealed at 1030° C. for 30 minutes under 100 sccm hydrogen, keeping the pressure around 100 Pa. After completion of the annealing process, graphene is grown under 400 sccm hydrogen and 1 sccm methane, keeping the pressure around 1000 Pa, growth time around 1.5 hours.

Growth process of few-layer graphene: the annealing condition is the same as that of bilayer graphene. After completion of the annealing process, graphene is grown under 900 sccm hydrogen and 1 sccm methane, keeping the pressure around 2000 Pa, growth time around 1 hour. Graphene film is grown on the copper foil eventually.

II) Removing the graphene film on unwanted surface of the copper foil by air plasma etching, because the graphene film can be grown on both surfaces of the copper foil. The copper foil grown with graphene is placed in a plasma device (Germany, Diener, pico model) with one side up, and treated for 3 minutes under the condition of 10 sccm flow rate and 200 W power. After the treatment, the graphene on one side of the copper foil is removed, and the graphene on the other side keeps intact.

III) Spin-coating positive photoresist on the side without graphene of the copper foil, spin-coating rate is 4000 rpm; spin-coating time is 60 s; then heating the photoresist at 110° C. for 3 minutes.

IV) Forming microscale sized array of circular holes (hole diameter is 5-20 microns) on photoresist by photolithography process. First photolithography mask is put on the side with photoresist of the sample, which is placed in ultraviolet lithography machine to expose for 10 s. Then the exposed sample is developed in the developer for 10 s, and fixed for 30 s inside the fixer solution, at last blew-dry by nitrogen, so that pattern on the photolithography mask can be replicated on the photoresist.

V) Placing 0.1 mol/L sodium persulfate etching solution onto heating table with constant temperature and heating to 50-60° C. The side with photoresist of the sample contact with contact solution and is suspended on the liquid surface of the etching solution, wherein the metal substrate exposed by the photoresist array of circular holes is completely etched using etching solution, yet the area covered with photoresist would not be etched, so that an array of suspended graphene support film is formed.

VI) Transferring the etched sample by using a stainless steel mesh from etching solution to surface of deionized water, washing it for 1 hour. After being washed, the sample is transferred into acetone to remove the photoresist. Then it is completely washed with isopropanol. Suspended graphene support film is obtained after being dried at room temperature.

Figure 2:
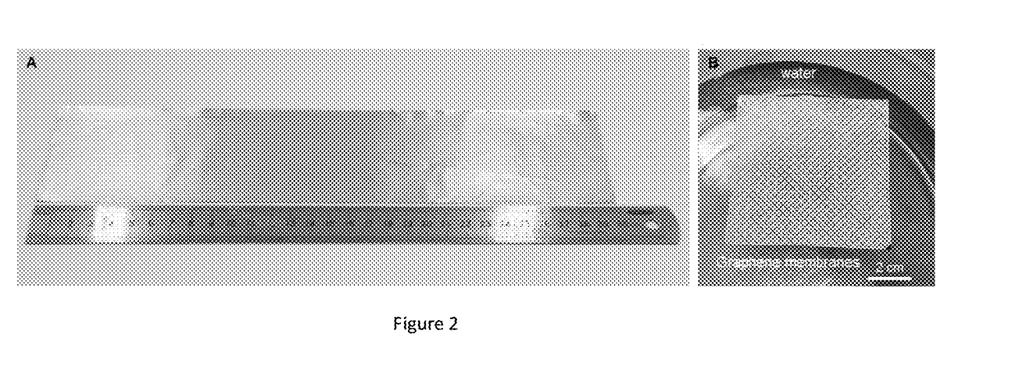
FIG. 2 is large-area graphene film prepared on copper foil and large-area graphene support film suspended on liquid surface in embodiment 1.

FIG. 2A is a photo of a large area graphene film prepared on copper foil by chemical vapor deposition in this invention; FIG. 2B is a photo of a large area graphene support film suspended on liquid surface.

Figure 3:
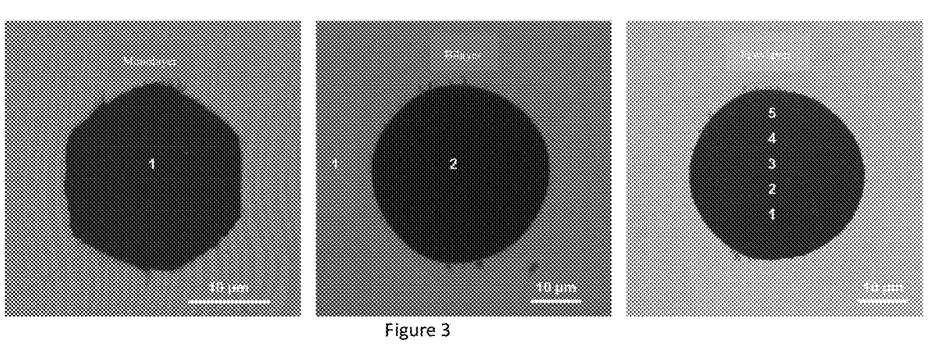
FIG. 3 are SEM characterization results of the monolayer, bilayer, few-layer (2-5 layer) graphene support film prepared in embodiment 1.

FIG. 3 are SEM Characterization results of the monolayer, bilayer, few-layer (2-5 layer) graphene support film prepared in this invention.

Figure 4:
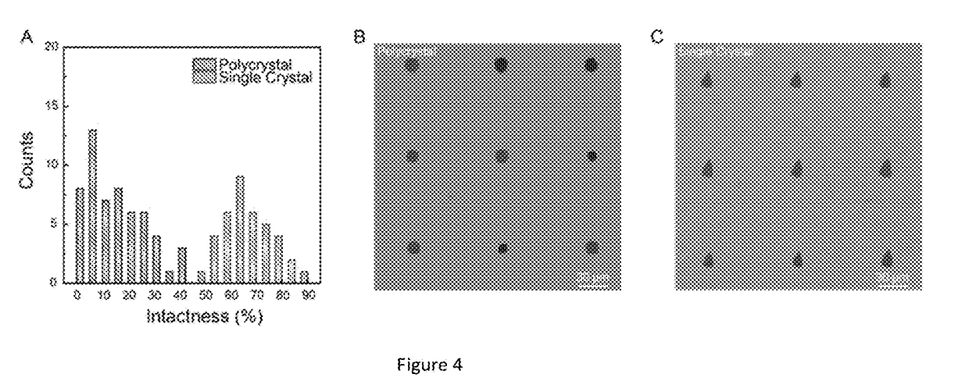
FIG. 4 is the intactness statistics of monolayer graphene single-crystal film and polycrystalline film in embodiment 1.

FIG. 4 is a comparison chart of the intactness statistics of monolayer polycrystalline graphene film and monolayer single crystal graphene film (4A), and their correspondingly representative scanning electron microscope (SEM) photo (4B and 4C). These small black holes in the photo indicate that the suspended graphene support film has been broken, the gray holes show that the graphene stays intact. The calculation method of the intactness is to calculate the ratio of holes being completely covered by graphene to 400 holes. The mechanical strength and intactness of single crystal graphene is higher compared to polycrystalline graphene.

Figure 5:
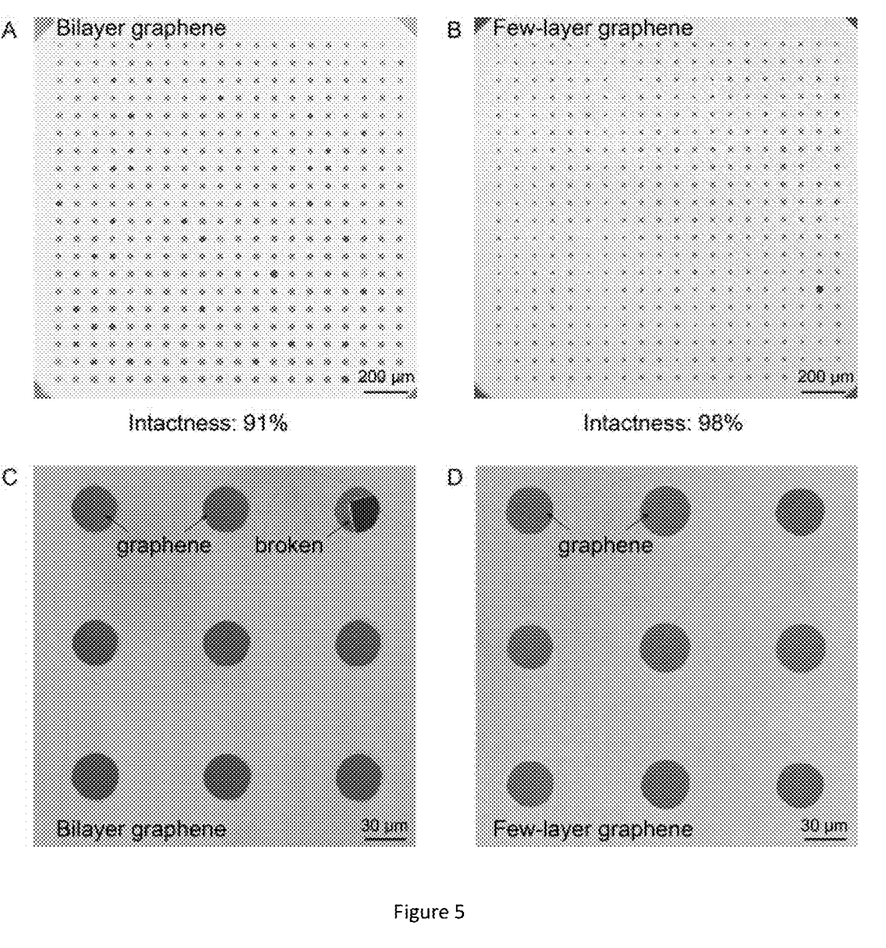
FIG. 5 are representative SEM characterization results of bilayer graphene support film and few-layer graphene support film in embodiment 1. The intactness of the bilayer and few-layer graphene support film is up to 91% and 98%, respectively.

FIG. 5 are representative SEM characterization results of the bilayer graphene support film and few-layer graphene support film. FIG. 5A is low resolution SEM image of the bilayer graphene support film. The intactness is up to 91%. FIG. 5C is high resolution SEM image of the bilayer graphene support film. Wherein the small black holes indicate that the suspended graphene support film has been broken, the gray holes show that the graphene stays intact. FIG. 5B is low resolution SEM image of the few-layer graphene support film, the intactness is up to 98%. FIG. 5D is high resolution SEM image of the bilayer graphene support film. The graphene support films both stay intact.

Figure 6:
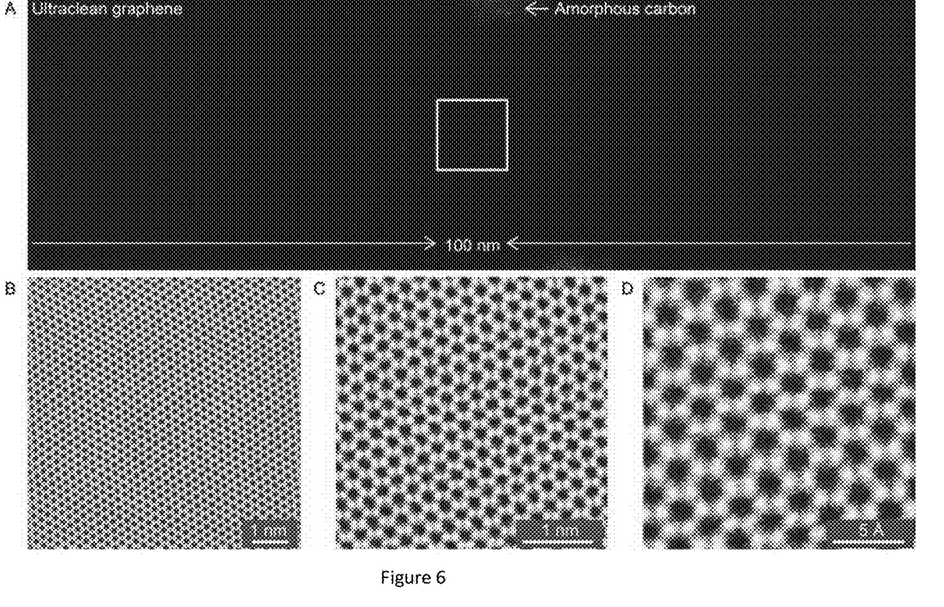
FIG. 6 is a high-angle annular dark-field-scanning transmission election microscope (HAADF-STEM) imaging of ultraclean monolayer graphene support film in embodiment 1. The continuous clean size of the graphene is up to 100 nm.

FIG. 6 is a high-angle annular dark-field-scanning transmission election microscope (HAADF-STEM) imaging of ultraclean monolayer graphene support film. The continuous clean size of the graphene is up to 100 nm. The clean region is free from any contamination by impurities (FIG. 6A). FIG. 6B shows the in situ amplified atomic-scale resolution imaging of the graphene clean region in FIG. 6A. FIGS. 6C&6D clearly show carbon atoms arranged in a hexagonal honeycomb in the graphene crystal lattice.

Figure 7:
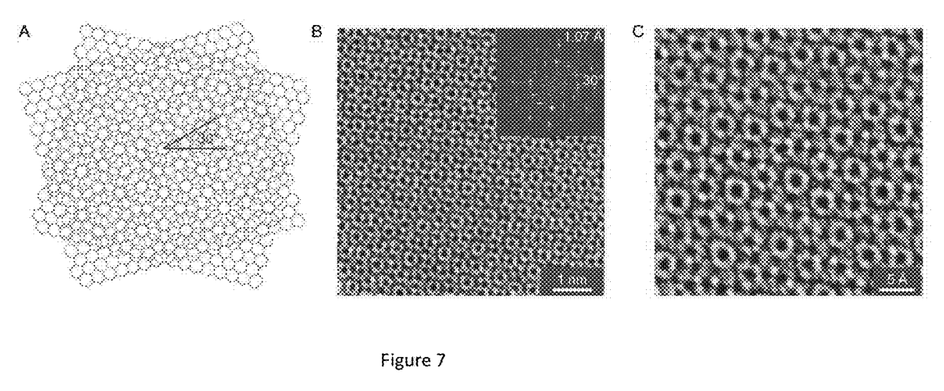
FIG. 7 is an atomic-resolution HAADF-STEM imaging of ultraclean bilayer graphene support film in embodiment 1, the resolution reaches 1.07 Å.

FIG. 7 is an atomic-scale resolution HAADF-STEM imaging of ultraclean bilayer graphene support film. FIG. 7A is a schematic diagram of the Moiré formed by rotating a bilayer graphene by 30 degrees. FIGS. 7B and 7C is the atomic-scale resolution imaging of the bilayer graphene rotated by 30 degrees, the resolution reaches 1.07 Å.

Figure 8:
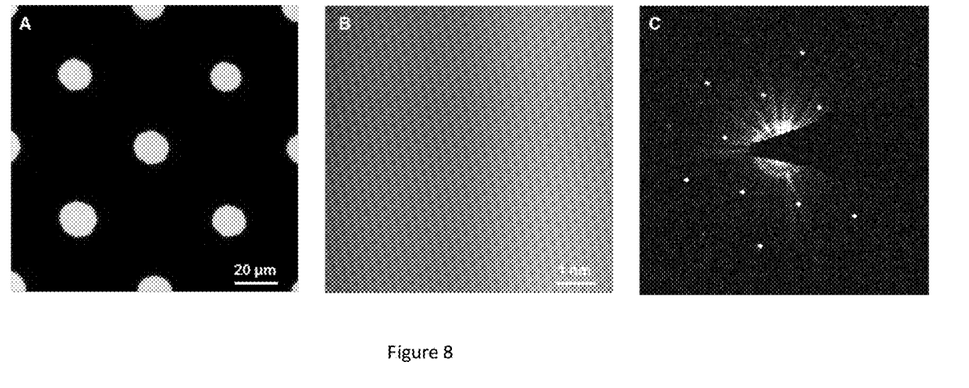
FIG. 8 shows that the graphene support film prepared in embodiment 1 is directly used as transmission electron microscope support film.

FIG. 8 shows that the graphene support film directly used as transmission electron microscope support film. FIG. 8A is a graphene support film array at low resolution. The hole part is a suspended graphene support film. The black opaque region is part of the metal substrate. Compared with the commercial ultrathin carbon film (thickness 3-5 nm), monoatomic layer graphene has a smaller background, is almost transparent against electron beam, is more beneficial to achieve the high-resolution imaging of the loaded sample. FIG. 8B is high resolution TEM imaging result of graphene. The graphene lattice is clearly visible and has no defects. As shown in FIG. 8C, the electron diffraction pattern of selected region shows the typical hexagonal diffraction pattern of graphene. This indicates that the arrangement of graphene support film is intact hexagonal lattice.

Figure 9:
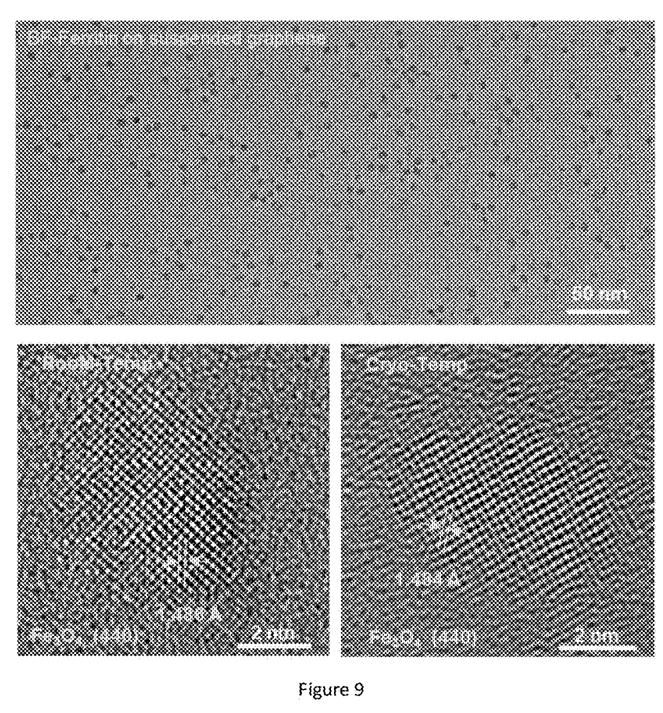
FIG. 9 shows that the graphene support film prepared in embodiment 1 is used for loading BF-Ferritin, and for achieving transmission electron microscope high resolution imaging.

FIG. 9 shows that the graphene support film is used for loading BF-Ferritin nanoparticles, and for achieving transmission electron microscope high resolution imaging, so that the effectiveness of the graphene support film in actual uses is further assessed. The BF-Ferritin particles are evenly distributed on the graphene support film. And atomic-scale resolution imaging of BF-Ferritin iron core is achieved both at room temperature and at liquid nitrogen temperature, the resolution reaches 1.48 Å.

INDUSTRIAL APPLICATION

The present invention has the following advantages:
1, the process of present invention is simple and low in cost. The suspended graphene support film can be prepared in a single etching step, transfer process of graphene is avoided. And the graphene can be mass-produced.
2, the number of layer of the graphene prepared in the present invention is controllable. Monolayer, bilayer, few-layer (3-5 layer) graphene support film can be prepared.

3, the graphene support film prepared in the present invention has high intactness, which is up to 90%-97%.

4, the graphene support film prepared in the present invention does not require any support by polymer film or fiber, and the surface of graphene has high cleanliness.

5, the graphene support film prepared in the present invention has large suspended area, the hole diameter is 10-50 microns.

6, the graphene support film prepared in the present invention can be directly used as transmission electron microscope support film, can be used to load samples such as nanoparticles, biological protein and the like for high resolution imaging.

The invention claimed is:

1. A method for preparing suspended graphene support film, comprising:
   1) Growing graphene films on both surfaces of the metal substrate;
   2) Etching off the graphene film on one side of the metal substrate obtained from step 1), spin-coating photoresist then performing photolithography, to obtain graphene/metal substrate/photoresist composite;
   3) Suspending the graphene/metal substrate/photoresist composite obtained from step 2) on the liquid surface of the etching solution, completely etching the metal substrate exposed by said photolithography process using etching solution, removing the photoresist to obtain said suspended graphene support film.

2. The method according to claim 1, wherein, in said step 1), said metal substrate is a monocrystalline and/or polycrystalline substrate of transition metal or transition metal alloy; said transition metal is selected from at least one of copper, nickel, molybdenum, and gold; said metal alloy is specifically a copper-nickel alloy;
   the thickness of said metal substrate is 10-30 μm;
   said graphene film is a monolayer large domain single crystal graphene film, bilayer graphene film or few-layer graphene film; said few-layer graphene film is specifically 2-5 layer graphene film;
   in said growth step, the growth process is chemical vapor deposition process.

3. The method according to claim 2, wherein, in said chemical vapor deposition process, the growth temperature is 980° C.-1050° C.; specifically, is 1030° C.;
   carrier gas is selected from at least one of hydrogen and argon;
   the flow rate of the carrier gas is 100-2000 sccm,
   carbon source gas is methane, ethylene or ethane;
   the flow rate of the carbon source gas is 1-10 sccm.

4. The method according to claim 2, wherein, in the growth of said monolayer large domain single crystal graphene film, the flow rate of the carrier gas is 100-1000 sccm;
   annealing process is carried out by first annealing at 980° C.-1050° C. for 0.5 to 8 h under 50-500 sccm hydrogen, then annealing for 10-60 min under 50-500 sccm Argon;
   growth time is 2-5 hours;
   growth pressure is 100-1000 Pa;
   in the growth of said bilayer graphene film, the flow rate of the carrier gas is 100-1000 sccm; annealing process is carried out by annealing at 980° C.-1050° C. for 0.5 to 8 h under, 50-500 sccm hydrogen;
   growth pressure is 500-2000 Pa;
   growth time is 1-4 hours;
   in the growth of said few-layer graphene film, the flow rate of the carrier gas is 500-2000 sccm; annealing process is carried out by annealing at 980° C.-1050° C. for 0.5 to 8 h under 50-500 sccm hydrogen;
   growth pressure is 1000-4000 Pa;
   growth time is 1-3 hours.

5. The method according to claim 1, wherein, in said step 2), the etching process is air plasma etching process; excitation power is 100-500 watts; etching time is 2-5 minutes; gas flow rate is 10-30 sccm;
   said photoresist is positive photoresist; spin-coating rate is 2000-7000 rpm, specifically is 4000 rpm; spin-coating time is 50-70 s;
   said photolithography is exposed to UV at 350 nm-365 nm or electron beam, exposure time is 5-15 s.

6. The method according to claim 1, wherein, in etching process of said step 3), etching temperature is 20-60° C.;
   etching solution is sodium persulfate solution, ferric chloride solution or aqua regia; concentration is 0.05-0.2 mol/L; the volume ratio of nitric acid and hydrochloric acid in the aqua regia is 1:3.

7. The method according to claim 1, wherein, said photoresist removal process is carried out by first treating with acetone, ethanol or N-methylpyrrolidone, and then treating with isopropanol.

8. The method according to claim 7, wherein, in said photoresist removal process, the transfer medium of the suspended graphene support film in different solution is metal mesh.

9. A suspended graphene support film prepared by the method of claim 1.

* * * * *